United States Patent [19]
Holmbo et al.

[11] Patent Number: 5,155,439
[45] Date of Patent: Oct. 13, 1992

[54] METHOD OF DETECTING AND CHARACTERIZING ANOMALIES IN A PROPAGATIVE MEDIUM

[75] Inventors: Dennis L. Holmbo, Redmond; Wendelyn Gavett; Barry L. Rosenow, both of Bend; Michael S. Overton, Beaverton, all of Oreg.

[73] Assignee: Tektronix, Inc., Wilsonville, Oreg.

[21] Appl. No.: 450,120

[22] Filed: Dec. 12, 1989

[51] Int. Cl.⁵ .......................................... G01R 31/11
[52] U.S. Cl. ..................................... 324/534; 324/527
[58] Field of Search ............... 324/527, 532, 533, 534, 324/539, 543, 642, 644; 356/73.1

[56] References Cited

U.S. PATENT DOCUMENTS

| | | | |
|---|---|---|---|
| 4,041,381 | 8/1977 | Hwa | 324/533 |
| 4,104,582 | 8/1978 | Lambertsen | 324/533 |
| 4,527,113 | 7/1986 | Hillerich | 324/533 |
| 4,898,463 | 2/1990 | Sakamoto et al. | 356/73.1 |
| 4,958,926 | 9/1990 | Bu-Abbud | 356/73.1 |
| 5,000,568 | 3/1991 | Trutna, Jr. et al. | 324/534 X |

FOREIGN PATENT DOCUMENTS 59-60337 4/1984 Japan .................................. 356/73.1

*Primary Examiner*—Jack B. Harvey
*Attorney, Agent, or Firm*—William K. Bucher

[57] ABSTRACT

A method for examining a propagative medium, such as a signal transmission cable, that requires the acquisition and examination of a minimum number of data points to determine the presence of an anomaly in the medium. When an anomaly is detected, its characteristics, such as loation, type and amount of loss are determined. The characteristics are then displayed. If the anomaly is a reflectionless loss, the region containing the anomaly is examined repetitively to determine its location and to improve the accuracy of its location measurement. With each successive level of examination, additional samples are collected within the region. The new samples are combined with the existing samples to reduce random noise in the data. Through this method the location of the anomaly is re-determined with greater accuracy.

34 Claims, 12 Drawing Sheets

METHOD OF DETECTING AND CHARACTERIZING ANOMALIES IN A PROPAGATIVE MEDIUM

BACKGROUND OF THE INVENTION

The present invention relates to anomaly detection and characterization in a propagative medium, and more particularly to a time domain reflectometry system that is used for locating irregularities in a signal transmission medium.

In telecommunications and network applications, transmitters and receivers are connected together via signal transmission cables, such as coaxial cables or optical fibers. Faults in these cables often result in undesired attenuation of signals transmitted over the cables resulting in lost information. Time domain reflectometers are used to test these cables to determine if they have irregularities, such as faults or other discontinuities, that would interfere with the transmission of information.

Time domain reflectometry is similar to radar. Pulses are transmitted into the medium and during the interval between pulses the return signal is examined for anomalies. When light propagates through an optical fiber, the fiber material scatters the light in a process known as "Rayleigh scattering". Some of the light is scattered back through the fiber to the transmitter. This light is referred to as "backscatter". The backscatter signal from a pulse launched into an optical fiber decreases exponentially with the rate of attenuation of the fiber. A discontinuity in the fiber where light is lost but no light is reflected, such as a splice, appears in the backscatter signal as an anomalous drop over a pulsewidth. A reflective event such as a mechanical connector causes a reflected image of the pulse to be added to the backscatter. Often an irregularity in the fiber is both reflective and shows a loss. Locating events with unacceptably large losses is of interest when determining fiber quality and fault location. From the known index of refraction of the fiber and a plot of return signal-versus-time, the location of an event in question can be determined relative to a known event such as the beginning of the fiber or a nearby connector or splice.

Typically, prior art optical time domain reflectometers, such as the OF235 Fiber Optical Time Domain Reflectometer manufactured by Tektronix, Inc. of Beaverton, Oreg. United States of America, sample the return signal at many, closely spaced points along the length of the fiber. The resulting sample data points are then displayed as an amplitude-versus-time plot, or waveform. Because backscatter is a weak signal, each data point in the waveform must be sampled many times and the results averaged to reduce noise to an acceptable level. Depending on the length of the fiber and the desired resolution of the display waveform, it may take a considerable amount of time, approximately ten minutes, to collect the waveform of data points. In addition, an operator must measure and interpret the displayed waveform to determine event location and amount of loss.

What is needed is a method of detecting and characterizing significant discontinuities in the backscatter signal, using a minimum number of data points with a minimum amount of averaging.

SUMMARY OF THE INVENTION

Accordingly the present invention is a method of examining a propagative medium, such as an fiber optic cable, for anomalies associated with discontinuities in the medium that affect the transmission of energy pulses through the medium. Energy pulses are transmitted into the medium and a return signal level is sampled to acquire data points. The number of samples taken for each data point is minimized as a function of maintaining a minimum signal-to-noise ratio for detecting an anomaly at a minimum threshold value. The number of data points required for detecting the presence of an anomaly is minimized as a function of dimensional extent of the anomaly. The determination of the presence of an anomaly in the acquired data is a function of comparing the return signal level in the acquired data to a predicted value. When an anomaly is detected in the acquired data, the characteristics of the anomaly are determined an displayed.

In the preferred embodiment of the present invention, optical energy pulses are transmitted into an optical fiber and the return energy, in the form of backscatter and reflections, is sampled. A minimum number of data points are acquired for examining the optical fiber for anomalies. The characteristics of each anomaly, such as type, location and amount of loss, are determined and stored in memory for display at a later time. The number of averages at each point along the fiber is varied to maintain only enough signal-to-noise ratio to detect an anomaly that is at least as large as a preselected threshold level. Examination of the fiber continues until the end of the cable is reached, or the signal is so small that the number of averages needed to reduce noise to the required level is too large to accomplish in a reasonable amount of time.

To detect the presence of an anomaly, the return signal is sampled at a location where there is no anomaly, and at another location later in the signal. The loss between these two points is then calculated and compared to the loss predicted from the fiber's rate of attenuation. If the measured loss differs from the expected loss by more than the uncertainty due to noise in the signal, there is an anomaly.

An anomaly in the fiber results in a discontinuity in the return signal which is approximately one pulsewidth wide. Therefore, to minimize the number of samples required, a long pulsewidth is used to detect anomalies. A "long" pulsewidth is approximately one hundredth of the range of the instrument for a typical fiber.

Once a discontinuity is detected, a narrower pulsewidth may be used to examine the region in question. A narrower pulsewidth resolves anomalies that are closer together and locates them more accurately.

When a reflective anomaly is detected, more data points are collected to locate the leading edge of the reflection. This is reported as the location of the anomaly. Then, data points are acquired to locate the end of the reflection, and the loss of the anomaly is measured. The region within the reflection is examined using a narrower pulsewidth to detect and locate reflections that are too close together to resolve with the long pulsewidth.

When a reflectionless loss is detected, data points are acquired from at least one pulsewidth before the beginning of the loss, to at least two pulsewidths after the beginning of the loss. At the location of each data point along this region, the rate of signal loss is calculated using all data points from the current location up to one pulsewidth after the current location. The location of the maximum in the resulting rate of loss-versus-location plot is determined. This represents the beginning of the steepest loss over one pulsewidth in the backscatter signal, and is the location of the anomaly. The anomaly's loss is also measured.

The objects, advantages and novel features of the present invention are apparent from the following detailed description when read in conjunction with the appended claims and attached drawings.

DESCRIPTION OF THE PREFERRED EMBODIMENT

The present invention is a method of examining a propagative medium for anomalies associated with discontinuities in the medium that affect the transmission of energy pulses through the medium. To detect such anomalies, data points are acquired by sampling a return signal level from the medium in response to energy pulses transmitted into the medium. When an anomaly is detected in the acquired data, the characteristics of the anomaly are determined and displayed. To minimize the amount of time required to detect an anomaly, the number of samples required for each data point is determined as a function of maintaining a minimum signal-to-noise ratio for detecting the anomaly at a minimum threshold value. The number of data points required for detecting the presence of an anomaly is minimized as a function of dimensional extent of the anomaly. The determination of the presence of an anomaly in the acquired data is a function of comparing the return signal level in the acquired data to a predicted value. This method of examining a propagative medium is used in detecting and characterizing anomalies in a fiber optic transmission medium.

Figure 1:
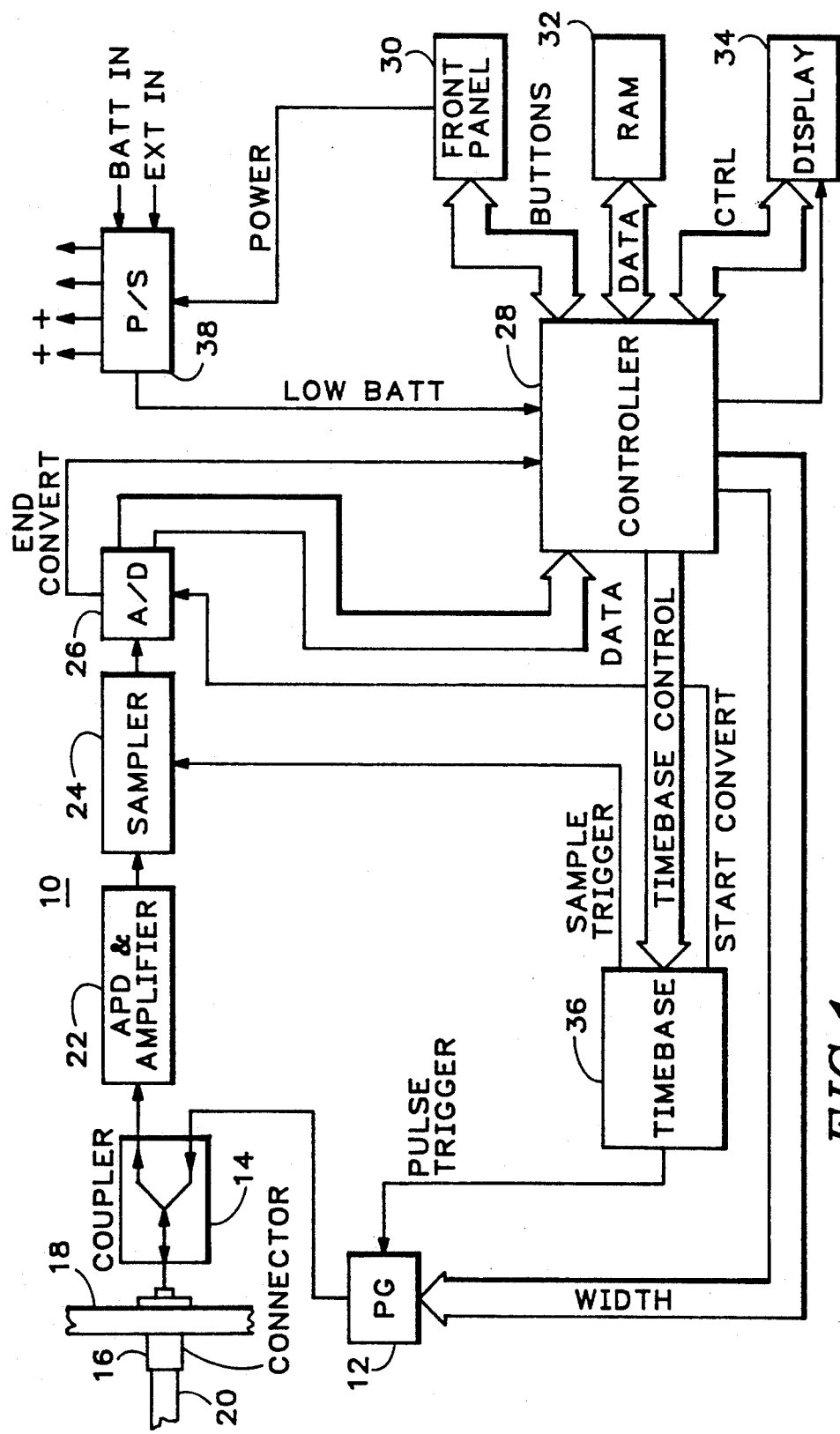
FIG. 1 is a block diagram of a time domain reflectometer for testing a signal transmission cable for anomalies according to the present invention.

Referring to FIG. 1, an optical time domain reflectometer (OTDR) 10 suitable for locating anomalies in an optical signal transmission cable is shown. An optical pulse generator 12, in response to a pulse trigger, sends an optical pulse via a coupler 14 to a connector 16 mounted in a housing 18 for input into one end of a cable under test 20. A solid-state semiconductor laser is used in the optical pulse generator 12 because of its small size, and to maximize the spectral purity and the amount of optical energy coupled into the fiber. The type of laser is chosen for wavelength and for the type of fiber to be tested. Depending on the type of laser, the peak laser power or the pulse repetition rate may need to be limited when using long pulse widths, in order to avoid damaging the laser. The return optical energy from the cable 20 enters the OTDR 10 via the connector 16 to the coupler 14. The return energy is passed by the coupler 14 to a detector/amplifier 22. The detector 22 may be a avalanche photodiode (APD) with associated amplifier. The resulting electrical signal from the detector/amplifier 22 is sampled by a sampling circuit 24. The data samples from the sampling circuit 24 are input to an analog-to-digital converter (ADC) 26, whose output is input to a controller 28 for processing. The controller 28 interacts with a front panel 30 by which an operator inputs appropriate operating parameters. The controller 28 has an external writable memory (RAM) 32 for storage of data, OTDR instrument settings, and other variables. The results of the examination of the data by the controller 28 are viewed on a display device 34, such as a liquid crystal display (LCD), in accordance with parameters provided by the controller 28.

The controller 28 starts examining the optical fiber 20 in response to a "start test" command from the front panel 30. After the controller 28 has configured and enabled a timebase 36, the controller goes into an inactive state in order to reduce system noise when the optical return signal is sampled. The timebase 36 sends a pulse trigger signal to the optical pulse generator 12 which responds by producing an optical pulse. The optical pulse travels from the pulse generator 12 through the coupler 14 to the connector 16 and into the fiber 20. The width of the optical pulse produced by the pulse generator 12 is set by the controller 28.

The optical return signal comes back from the fiber 20 through the connector 16 and coupler 14 to a detector/amplifier 22 where it is converted into an electrical signal and coupled to the input of the sampler 24. At a programmable delay after the pulse trigger, a sample trigger from the timebase 36 causes the sampler 24 to sample the signal that has returned from the location on the fiber that corresponds to this delay. The timebase 36 then sends a start-convert signal to the ADC 26 which converts the analog data from the sampler to a digital sample.

When the ADC 26 is finished converting data, it notifies the controller 28 with an end-convert signal. The controller wakes from its inactive state, processes the data from the ADC 26, and determines if it is finished collecting samples at the current location. If the controller is finished, it disables the timebase 36. If it is not finished, it goes inactive and the timebase repeats the process with another pulse trigger signal. The interval between the pulse triggers and the delay from a pulse trigger to a sample trigger are determined by the timebase control parameters from the controller 28.

After the entire cable 20 has been examined to detect anomalies and determine their characteristics, the controller 28 formats the results for viewing on a display device 34 in symbolic and alphanumeric format. The operating parameters and measurement directions received by the controller 28, and the formatting and displaying of the data on the LCD 34 are described in co-pending U.S. patent application titled "A Method of Displaying Acquired Data", Ser. No. 289,660, filed Dec. 12, 1988, and assigned to the assignee of the present application.

Figure 2:
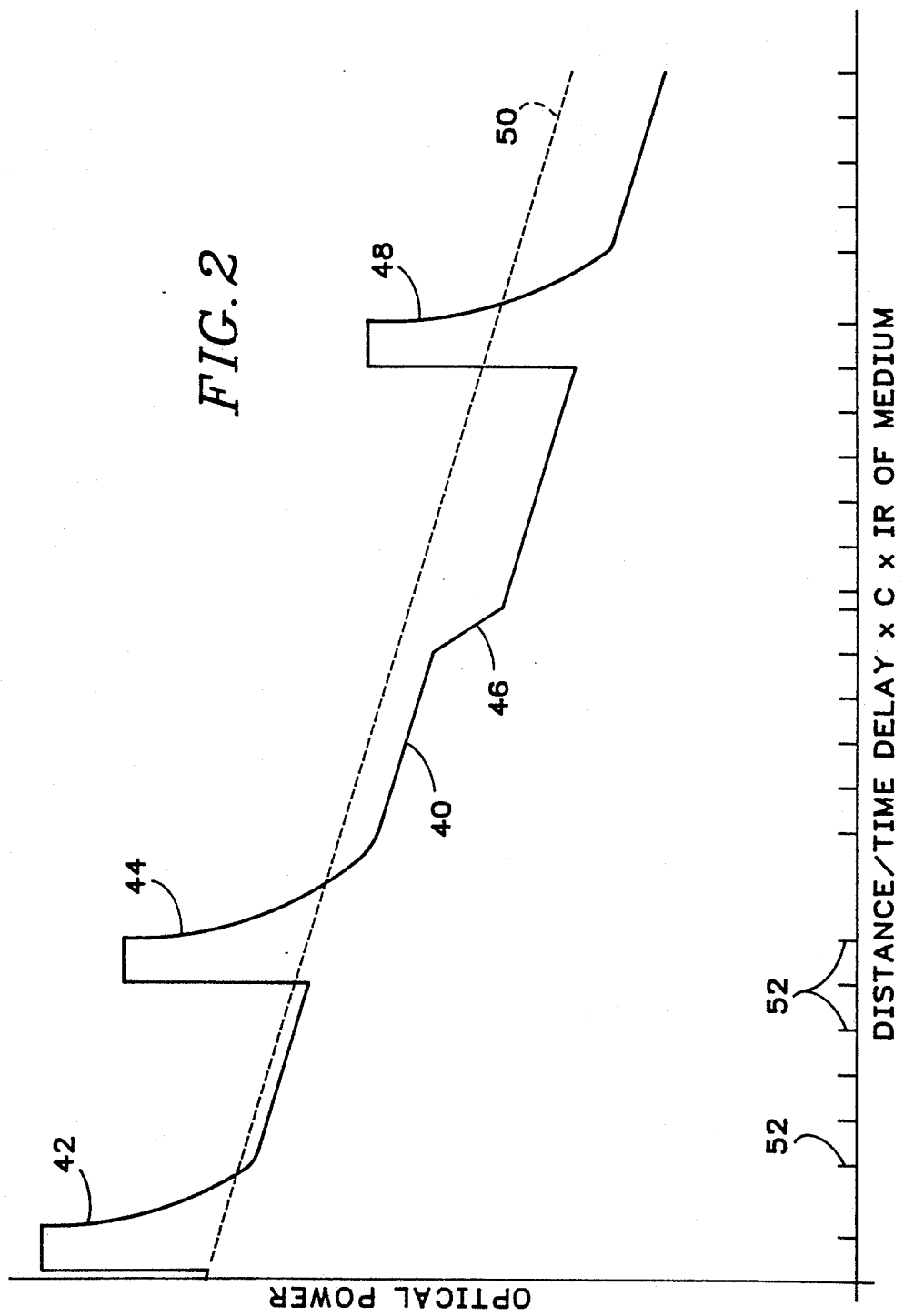
FIG. 2 is an amplitude versus time plot of an acquired waveform of data from a conventional OTDR.

Referring to FIG. 2, there is shown an logged amplitude versus time plot of an acquired waveform of data 40 from a conventional OTDR showing a front panel connector reflection 42, a reflection anomaly with loss 44, a reflectionless loss anomaly 46, and a reflection anomaly without loss 48. The dashed line 50 represents the exponentially decreasing backscatter signal, converted to a logarithmic scale, that would be expected if there were no anomalies with loss. Optical fibers show a constant rate of signal attenuation over the length of the fiber. In the examination routine to be described below, data points represented by lines 52 are acquired along the length of the fiber and the loss over the region between the data points is compared to the predicted rate of loss for the fiber to determine if an anomaly exists within the interval defined by the data points. The acquisition of data points 52 and the determining of the presence of anomalies continue until the signal level value of the last acquired data point decreases to a point where the number of averages required to reduce the noise sufficiently, is too large to accomplish in a reasonable amount of time, or the end of the cable is reached.

Figure 3:
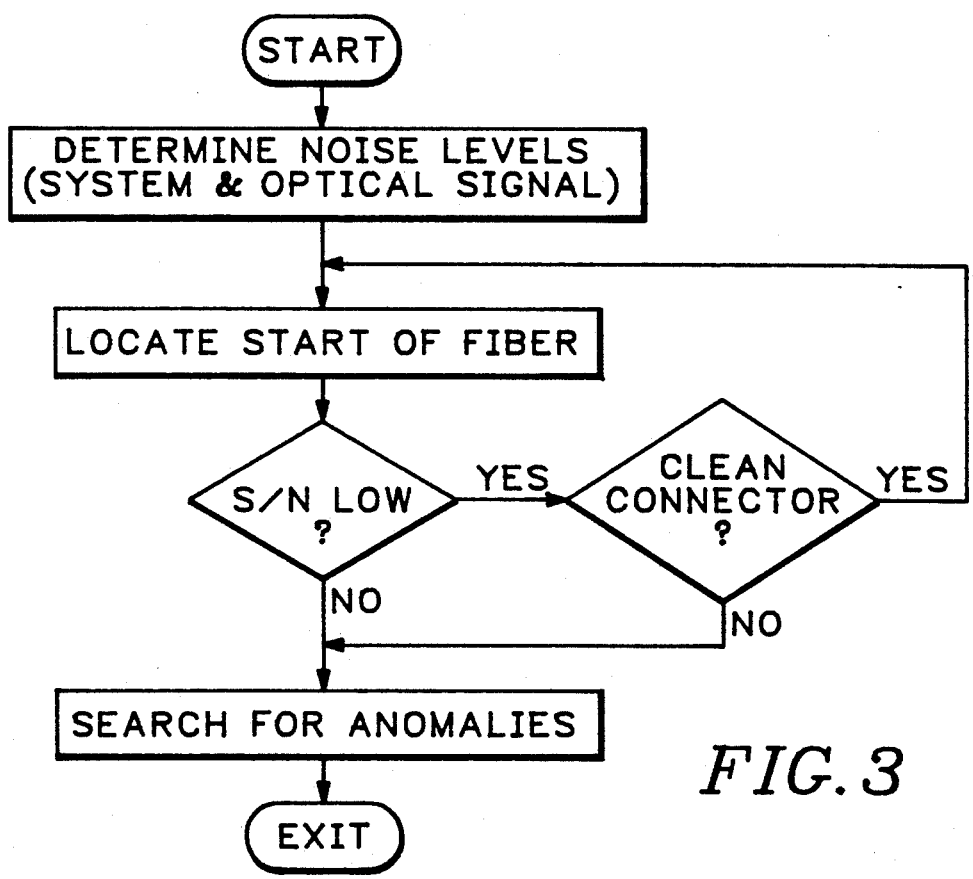
FIG. 3 is a flow chart of an examination routine according to the present invention.

The procedure for examining the optical fiber 20 using the time domain reflectometer 10 is described with reference to the flow chart shown in FIG. 3. The examination routine begins by measuring the random noise in the return signal. After samples are collected to measure this noise, data points are acquired using a data acquisition routine. The data acquisition routine uses these noise measurements to determine the amount of averaging necessary to reduce the noise to an acceptable level. Two types of random noise are taken into account. First the noise level routine measures a system noise level that is independent of the return signal. Then it determines an optical noise level that is proportional to the return signal level.

Figure 4:
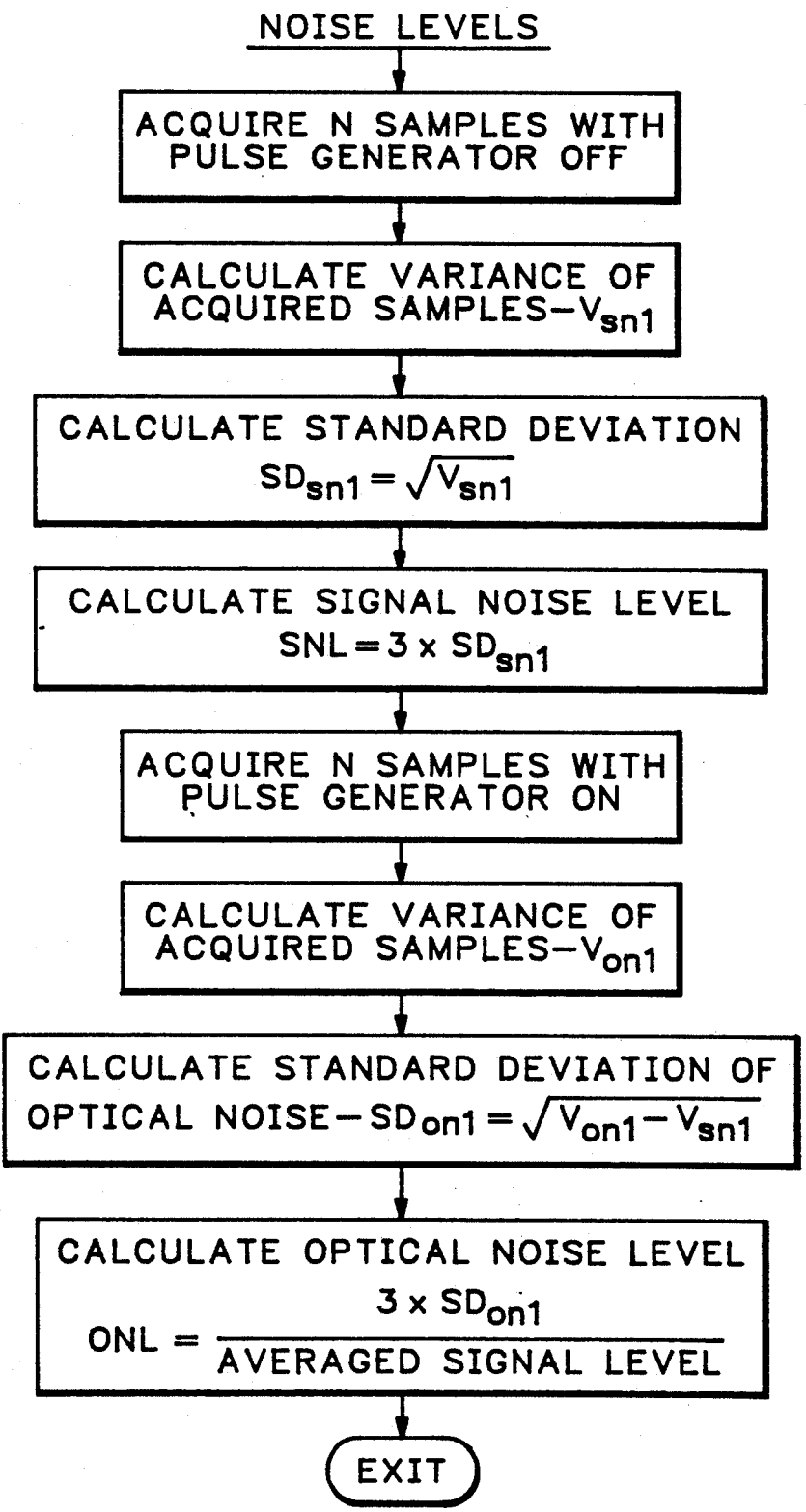
FIG. 4 is a flow chart of a noise level determination routine according to the present invention.
Figure 5:
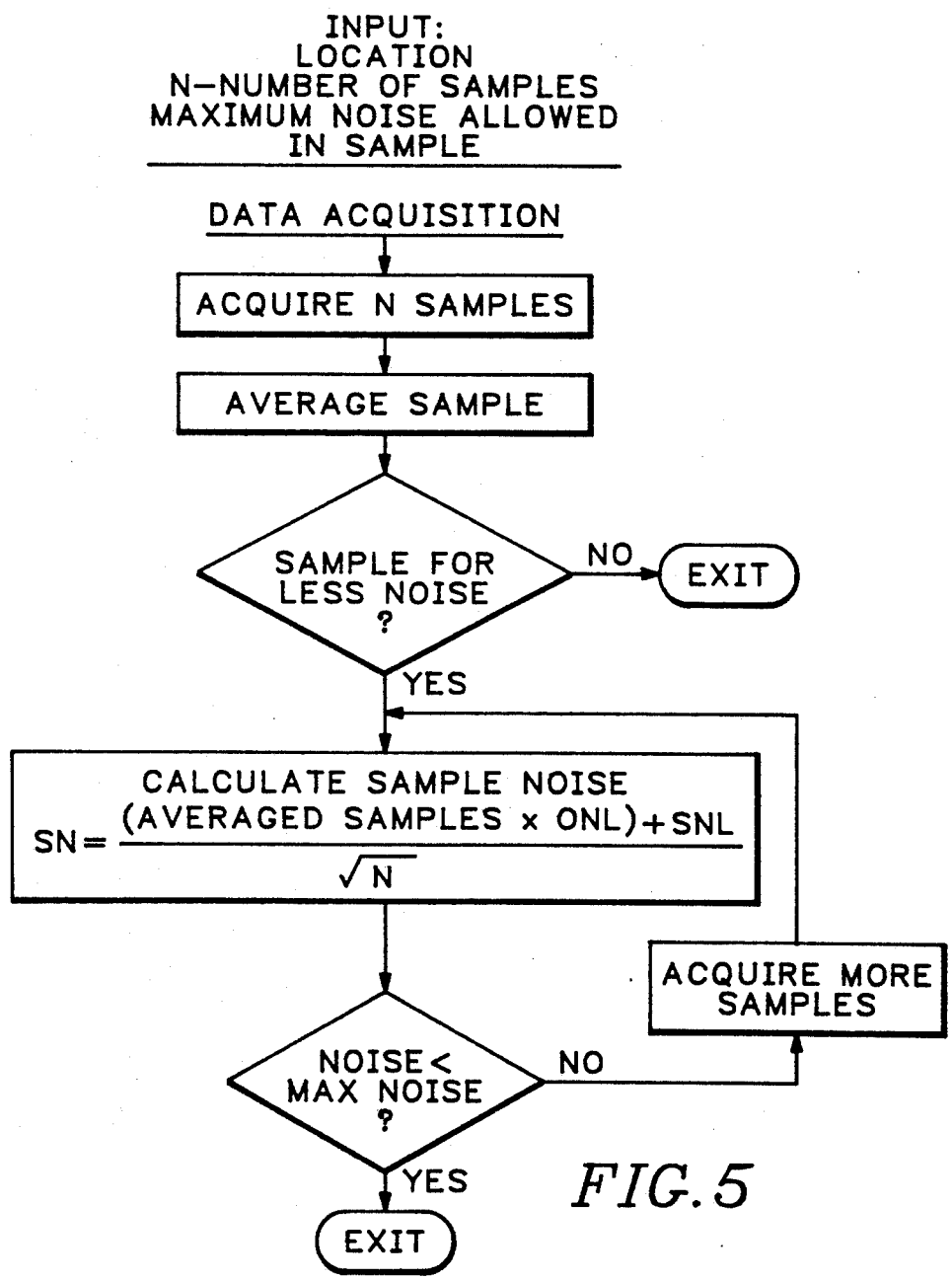
FIG. 5 is a flow chart of a data acquisition routine according to the present invention.

To determine the system noise level, the noise level routine, shown in FIG. 4, collects a number of samples with the pulse generator disabled, and calculates the variance of these samples. This is the system noise variance, and its square root is the system noise standard deviation. The system noise level is calculated as three times the system noise standard deviation. To determine the optical noise level, the routine collects multiple samples with the pulse generator enabled at a location with a substantial return signal. The optical noise variance is the variance of these samples minus the system noise variance. The optical noise level is calculated as three times the optical noise standard deviation, divided by the signal level at this location. When the data acquisition routine, shown in FIG. 5, samples the return signal at a location, it determines the noise associated with the resulting data point by multiplying the data value by the optical noise level, and then adding the system noise level. This is then divided by the square root of the number of samples averaged together to obtain the data point.

The inputs to the data acquisition routine are the location to sample at, the minimum number of samples to average, and the maximum tolerable amount of noise relative to the signal level. The data acquisition routine acquires a data point by sampling the return signal the requested number of times, averages the samples, and calculates the noise in the result. Then the routine either exits or continues accumulating and averaging samples, and determining the noise in the result, until the noise is less than the amount specified. The accumulation of additional samples is used to maintain the minimum signal-to-noise ratio needed to detect an anomaly of a given size, and to acquire values for loss measurements with a known minimum accuracy. The results of the routine are the value of the signal at the location, the noise or uncertainty in the measurement, and the number of averages used.

Figure 6A:
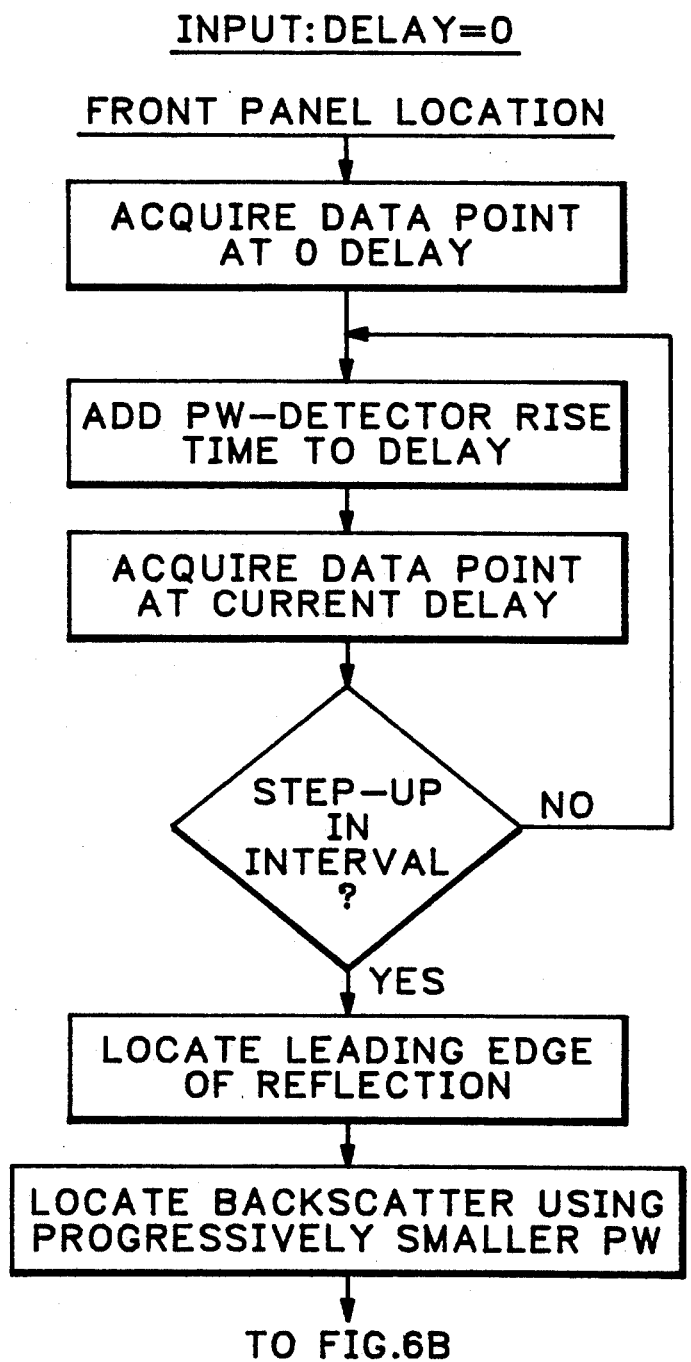
FIGS. 6A and 6B is a flow chart for locating the start of a fiber according to the present invention.
Figure 6B:
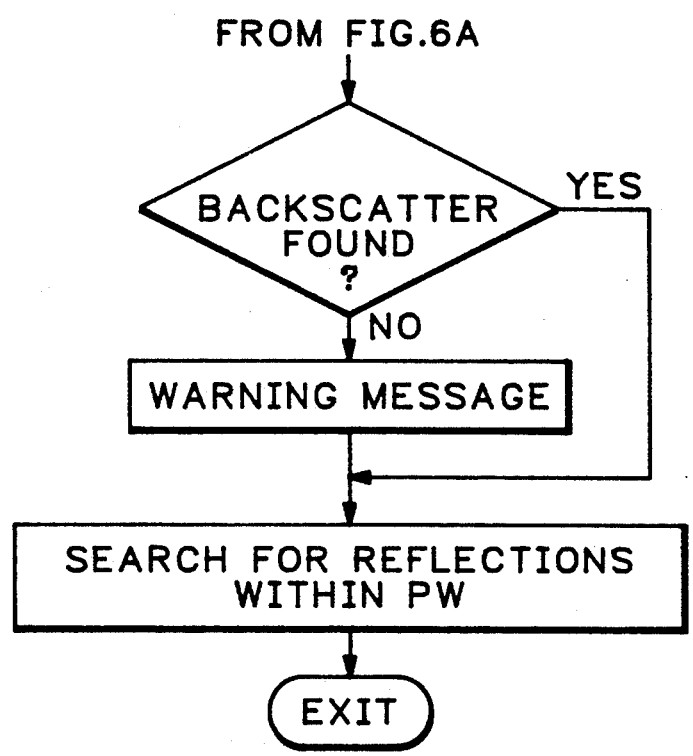

The location of all anomalies on the fiber 20 are reported relative to the connector 16 at the beginning of the fiber. After determining noise levels, the examination routine locates this connector 16. The start of fiber location routine, shown in FIGS. 6A and 6B, acquires data points starting with zero delay and separated by a pulsewidth minus the risetime of the detector/amplifier 22. This sample spacing guarantees that a reflection cannot go undetected by fitting between data points. The routine looks for a significant step-up in the signal that would indicate a reflection from the connector 16. Then, as described in greater detail below, the leading edge and the end of the reflection are located. The location of the leading edge is saved as the location of the connector 16, and is subtracted from all subsequent location measurements.

The signal-to-noise ratio of the backscatter signal at the end of the reflection is measured to ascertain the quality of the connection. If there is no signal, the examination routine finds the end of the reflection at progressively smaller pulsewidths, until either a backscatter signal is found or the narrowest pulsewidth is reached. This allows the testing of a fiber that is shorter than the longest pulsewidth. Then, the region of fiber that is masked by the current pulsewidth is searched for reflections using the narrowest pulsewidth. Because the narrowest pulsewidth contains too little energy to produce significant backscatter, it is used primarily to detect reflective anomalies that are too close together to be resolved with longer pulsewidths. If no backscatter is detected, the operator is warned that only the locations of reflective anomalies are reported, and no loss measurements or information on nonreflective anomalies are available. If backscatter is detected, the examination routine continues with the pulsewidth that detected backscatter. If the signal-to-noise ratio of the backscatter is too low to achieve the minimum dynamic range of the instrument, the operator is given the option of either continuing the examination of the fiber or improving the connection by cleaning the connectors, and re-measuring the signal-to-noise ratio.

Figure 7:
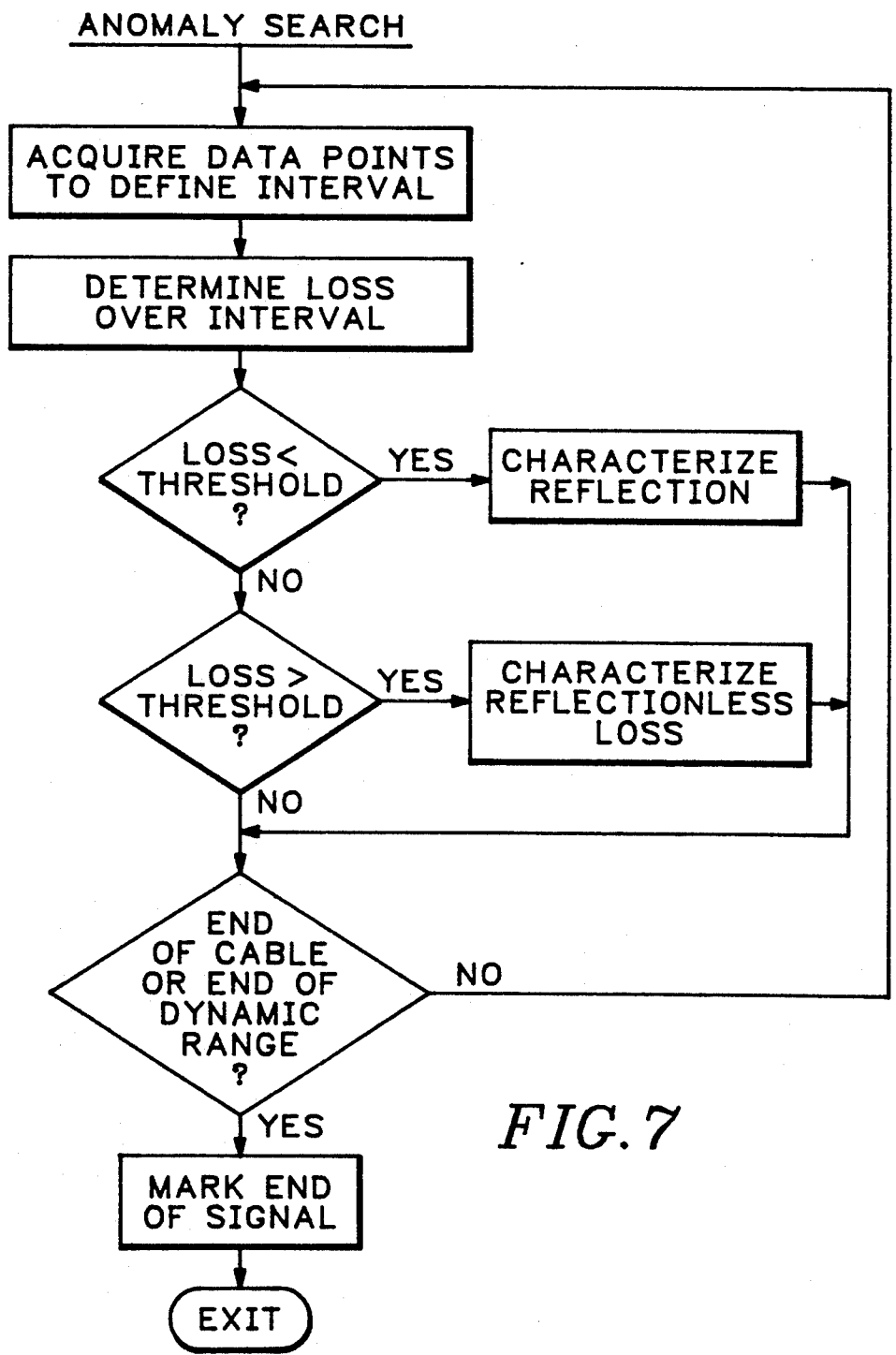
FIG. 7 is a flow chart of a anomaly search routine according to the present invention.

Once the examination routine is on backscatter, it begins to search for anomalies as shown in FIG. 7. To detect an anomaly, the loss between two acquired data points in the return signal is calculated and compared to the loss predicted from the fiber's rate of attenuation. If the loss is less than expected and the first location is on backscatter, the latter location must be on a reflection. If the loss is greater than expected, there must be an anomaly with loss between the two data points.

An equivalent detection method uses the value of one data point and the fiber's rate of attenuation to predict the value of the other data point. In general, the value of the data point in question can be predicted through numerical analysis of one or more data points. If the predicted value of the data point is inconsistent with the measured value, an anomaly is indicated.

An anomaly might not be detected if a data point is at a location that is partially through a signal transition due to the anomaly. For example, comparing a data point halfway up a reflection to a data point either before or on the reflection may not result in the detection of the anomaly, whereas comparing the data point before the reflection to the data point on the reflection would result in a detection.

To achieve maximum sensitivity for detecting an anomaly, the total deviation from the expected loss is encompassed by an interval defined by the two data points used to measure the loss of the signal. This is ensured by overlapping measurement intervals. The overlap must be at least as long as a transition due to an anomaly. A transition due to a reflection is the length of the risetime of the detector/amplifier 22. A transition due to a reflectionless loss is one pulsewidth long.

By using a sample spacing of one pulsewidth minus the risetime of the detector/amplifier 22, a reflection cannot exist between two samples and go undetected. In the preferred embodiment, the loss of each data point relative to each of the previous two data points is measured, and an anomaly is flagged if either does not correspond to the expected loss of the fiber.

The noise of each data point is averaged down to $\frac{1}{4}$ of the anomaly threshold, the minimum deviation that will be detected. Therefore, the uncertainty in a loss determination based on two data points is $\frac{1}{2}$ of the anomaly threshold. An anomaly with loss is detected if the measured signal loss is greater than the expected loss plus measurement uncertainty. A reflection is indicated if the signal loss is less than the expected loss minus the uncertainty. Reducing the noise to this level requires the least amount of averaging to resolve an anomaly at least as large as the threshold.

If only anomalies with losses are of interest, the following method, which requires even fewer data points, may be used. Because a loss affects all later backscatter points, the maximum distance between the two data points used to measure the loss of the signal is limited only by the noise in the signal and the uncertainty in predicting the signal. Thus, anomalies with loss are searched for within large regions. When a region is found that contains a loss, the region is divided by collecting two data points near the middle of the region, which are separated by the overlap required for detection. Each half of the region is then checked for an anomalous loss. As long as the loss is detected, this process continues until the region containing the anomaly is a few pulsewidths wide. Then the region is sampled and examined as previously discussed.

Figure 8:
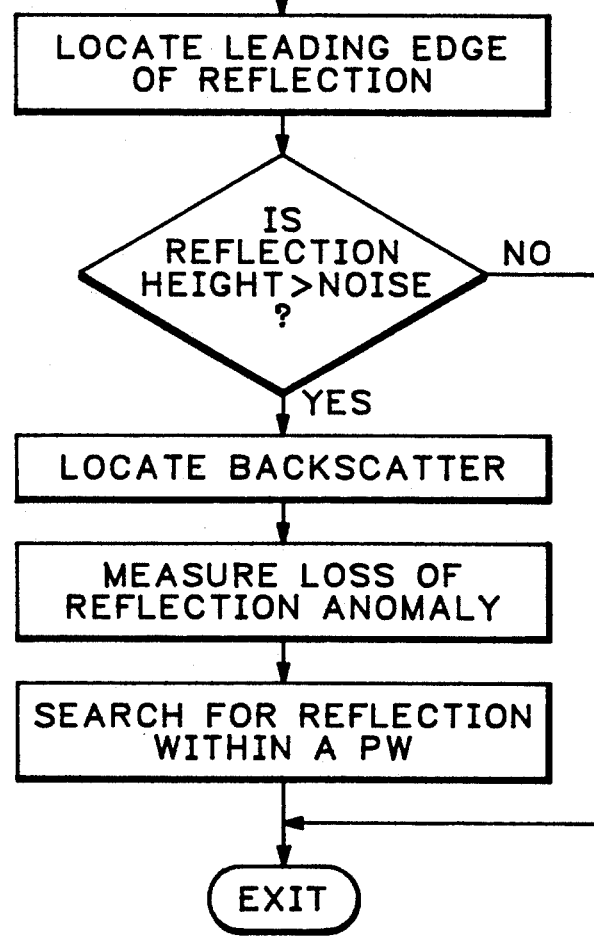
FIG. 8 is a flow chart of a reflection anomaly characterization routine according to the present invention.

When a reflection is detected, the reflection analysis routine, as shown in FIG. 8, is used to locate the leading edge and where the signal returns to backscatter after the reflection. This routine also measures the signal loss from immediately before to immediately after the reflection, and uses the narrowest pulsewidth to look for reflections that are masked by the longer pulsewidth reflection. The routine then reports the location of the leading edge as the location of the anomaly, the amount of loss measured, the location of any reflections found using the narrowest pulsewidth, and where backscatter begins. The location where the signal is back to backscatter is where the examination routine continues searching for anomalies.

Figure 9:
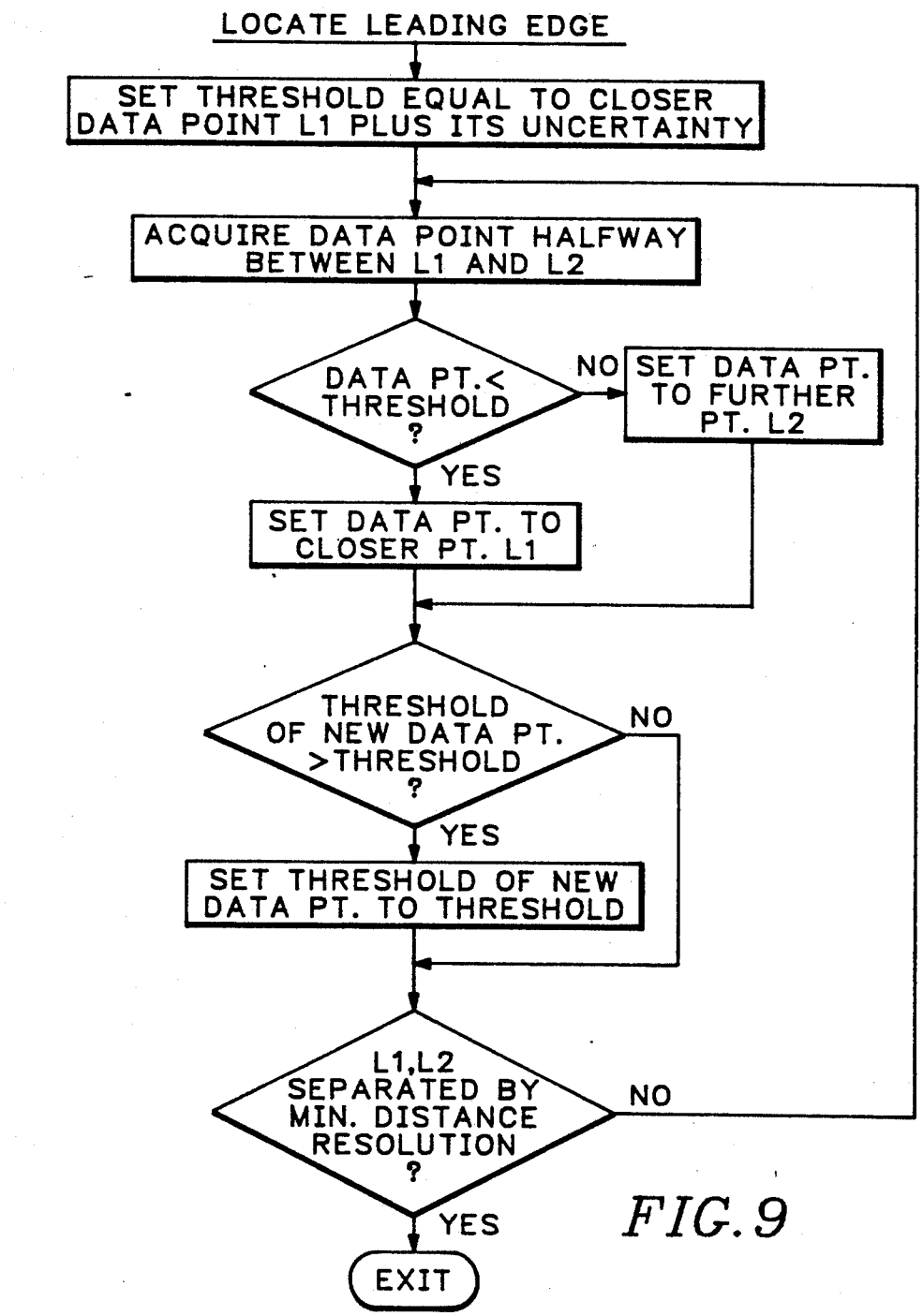
FIG. 9 is a flow chart for locating the leading edge of a reflection according to the present invention.

The reflection routine locates the leading edge of the reflection using the following method, as shown in the flow chart of FIG. 9. It starts with the two data points used by the examination routine to detect the reflection. The first acquired point is defined as the closer point and the other is defined as the further point. A threshold level is set equal to the value of the closer point, plus its uncertainty as determined by the data acquisition routine. A data point is then collected halfway between the two points. If the value of the new point is less than the threshold, it becomes the new "closer" point. If it is greater than the threshold, it becomes the new "further" point. If the threshold calculated from the new point is less than the current threshold, it becomes the new threshold. With the new closer and further data points, the routine repeats this process until the two points are separated by the minimum distance resolution of the instrument. The final closer point is taken to be the location of the leading edge of the reflection.

While collecting data points for the purpose of locating the leading edge, the routine saves the minimum and maximum values, and their uncertainties. If the difference between the minimum and maximum values is less than the sum of their uncertainties, the reflection routine quits and the examination routine continues searching for anomalies as though there had been no detection.

After receiving a substantial reflection, the detector requires time to recover so that its response corresponds to the optical return signal. This phenomenon, commonly called "tail", prevents the electrical signal from the detector/amplifier 22 from returning immediately to backscatter after most reflections. Because the reflection routine measures the loss of the anomaly from the backscatter level just before the leading edge to the backscatter just after the reflection, it must locate where the signal has returned to backscatter. Also, here is where the examination routine resumes its search for anomalies.

To locate where the signal returns to backscatter, the routine begins sampling the signal one pulsewidth after the leading edge. It acquires data points separated by $\frac{1}{4}$ of a pulsewidth and measures the rate of loss using each set of four consecutive points. When the measured rate of loss is within the acceptable range for the rate of fiber attenuation, the routine stops. It marks the location of the furthest of the four points used to measure the loss as the end of the reflection and the beginning of backscatter. The routine then measures the loss from the location of the minimum value sampled while locating the leading edge, to the location of the end of the reflection. After subtracting the loss expected from the rate of attenuation of the fiber, the routine saves this loss as the loss of the anomaly.

To make sure that there are no reflective anomalies masked by the reflection of the longer pulsewidth, the narrowest pulsewidth is used to locate any reflections from the leading edge to the end of the reflection originally detected. Because the narrowest pulsewidth does not contain enough energy to generate a significant backscatter signal, the loss of any reflections, or the presence of any reflectionless losses masked by the longer pulsewidth cannot be measured. The procedure for finding reflections within a larger reflection is the same as searching for anomalies in the fiber with the exception that loss detection is not performed. When a reflective anomaly is detected, the routine for locating the leading edge of a reflection is used to determine its location. After reporting the location, loss, end of reflection, and the location of any masked reflective anomalies, the reflection routine exits and the examination routine continues searching the fiber.

When a reflectionless loss is detected, the anomaly detection routine previously described is repeated using the narrowest pulsewidth that produces an adequately strong backscatter signal. A narrower pulsewidth resolves closely spaced anomalies better, and locates anomalies with greater accuracy.

Figure 10A:
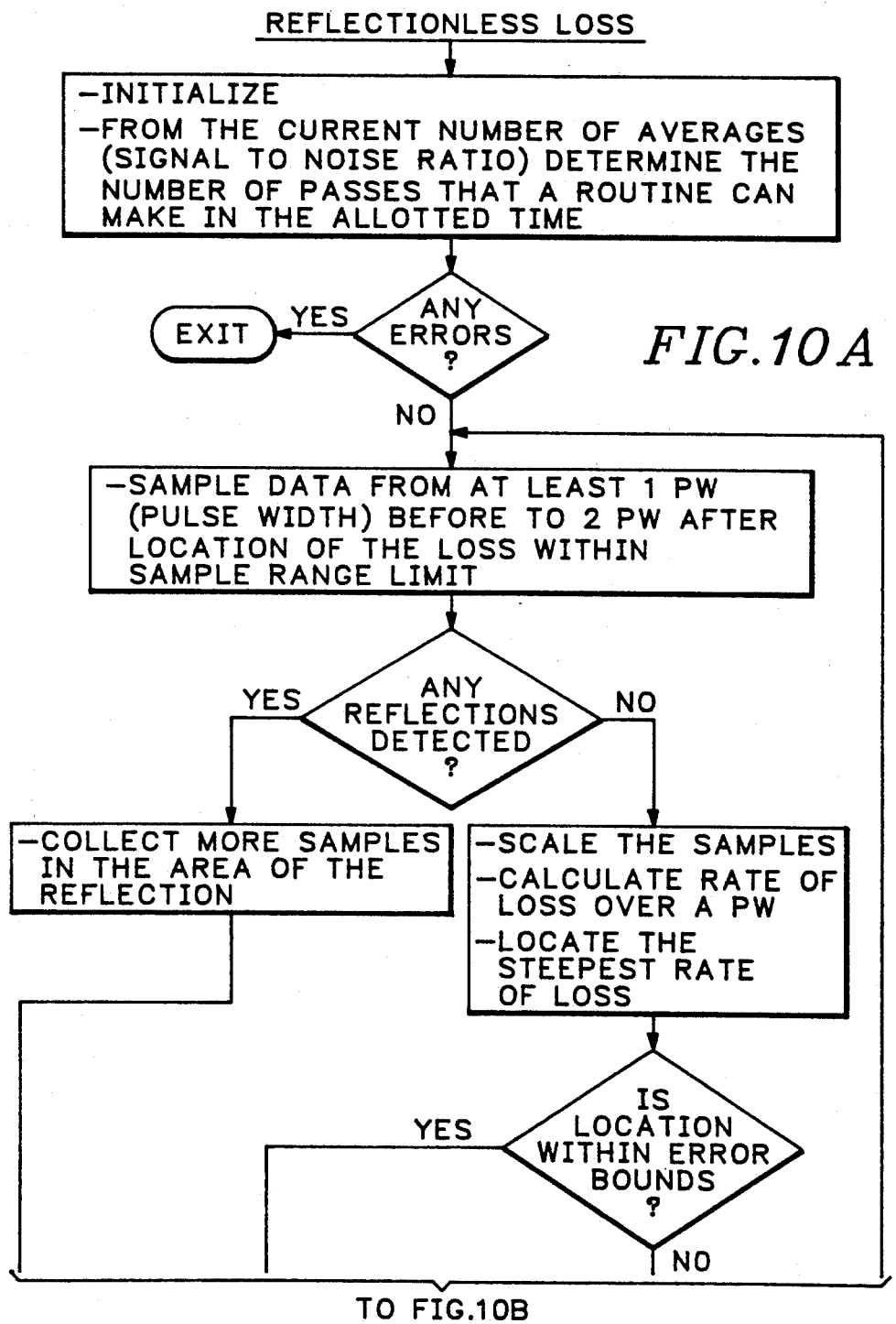
FIGS. 10A and 10B are a flow chart of a reflectionless loss anomaly characterization routine according to the present invention.
Figure 10B:
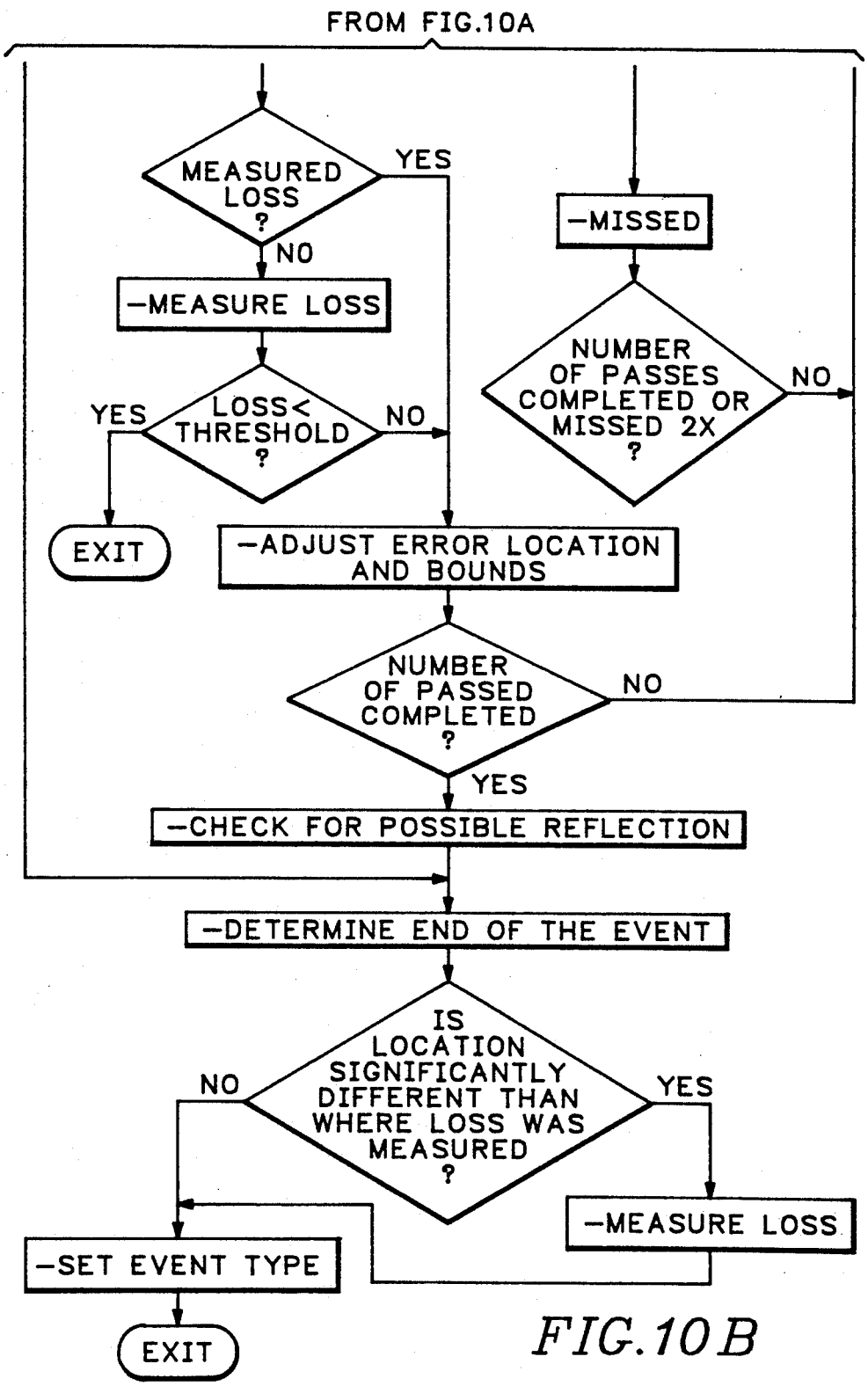

The reflectionless loss analysis routine is then used to characterize the anomaly. This routine, shown if FIGS. 10A and 10B, repetitively examines a region containing the anomaly to determine the location of the anomaly and to improve the accuracy of this measurement. With each successive level of examination, additional samples are collected within the region, and the new samples are combined with the existing samples, thereby reducing random noise in the data. The location of the anomaly is then re-determined with less uncertainty. Once the anomaly has been located with sufficient accuracy, the routine also measures the signal loss at the anomaly and reports it along with the anomaly's location and location uncertainty estimate, plus whether or not a reflective component was detected at the anomaly.

The routine begins with the approximate location of the reflectionless loss. To prevent sampling on adjacent known anomalies, the routine sets limits to the range over which it can take samples. It calls the data acquisition routine to determine the amount of averaging required to achieve the minimum signal-to-noise ratio necessary for the loss threshold selected by the operator. This is the averaging used for the first level of sampling. Based on the amount of averaging, the number of data points needed to execute each level and the number of acquisitions possible within the specified allowed time, the routine sets the maximum number of levels to execute.

For each level, data points are acquired at the current averaging. The region over which samples are collected is from one pulsewidth before the earliest possible location to two pulsewidths after the latest possible location within the sampling range limits. The earliest possible location is the current value for the location less the current location uncertainty estimate. The latest possible location is the current location plus its uncertainty.

The data points are spaced so that an integer number of spaces equals a pulsewidth. The uncertainty in the location measurement due to random noise in the data is reduced at each level by re-sampling the region and combining the new samples with existing data. In the preferred embodiment, new data points are collected at the same averaging as the existing data points, and the new data point samples are combined with the existing data in either of two ways. One way is to acquire each new data point equidistant between two adjacent existing data points, thereby halving the sample spacing. The other way is to double the effective averaging of the data points by acquiring new samples at the same locations, and averaging the new samples with the existing data.

To locate the anomaly using the data, the data points are first scaled-up to avoid truncation errors during calculations due to a finite resolution of the word size of the processor. A scale factor is calculated by dividing the maximum value for the word size by the maximum data value. Then, each data value is multiplied by this scale factor. At the location of each data point, the relative rate of loss of the signal over the next pulsewidth is calculated. One way of determining the rate of loss is to use curve fitting techniques, such as linear regression. However, for the sake of computational simplicity, the relative rate of loss is approximated in the preferred embodiment by summing the data points from the first portion of the pulsewidth and subtracting an equal number of data points from the last portion.

The location of the maximum in the resulting relative rate of loss-versus-location plot is a good value for the location of the reflectionless loss. The location of this maximum is found by fitting a parabolic curve to the values within half a pulsewidth of the maximum value of relative rate of loss, and calculating the location of the maximum of this parabolic curve.

Signal loss of the anomaly is determined by measuring the decrease in the return signal from the anomaly's start to its end. This decrease, less the loss expected between these two points from the rate of attenuation of the optical fiber, is the loss at the anomaly. The start of an anomaly is its location less the location uncertainty. If the the anomaly is a reflectionless loss, the end of the anomaly occurs one pulsewidth after its start plus the location uncertainty. If the anomaly is a reflection characterized by the reflectionless loss routine, the location used for its end is one pulsewidth after its start, plus the falltime of the detector/amplifier 22, plus the location uncertainty.

The location uncertainty of the approximate location that is input to the routine is one pulsewidth, which is the uncertainty of the detection routine. At each level, the routine improves the measured location of the reflectionless loss and updates the uncertainty estimate. The loss at the anomaly is measured at the first level where the measured location is within the range defined by the previous location plus or minus its uncertainty. On any level where the new location is not within the uncertainty range, the previous location and uncertainty are not updated with the new values. If the measured location misses the uncertainty range for two consecutive levels, the last valid measured location, if any, is reported with the anomaly's characteristics and the routine terminates. This keeps the routine from continuing to collect and process data when, for whatever reason, it loses the location of the anomaly. If the measured loss is less than the threshold level selected by the operator, the routine terminates and the examination routine continues as though there had been no detection.

The uncertainty estimate at each level comes from a table of empirically derived estimates. Each estimate in the table is based on the standard deviation of the location determined by the routine for simulated data representing a reflectionless loss. For each level, the standard deviation is calculated using a statistically significant number of trials with gaussian noise added to the data.

The increase in loss relative to the loss threshold that reduces the uncertainty estimate by the same amount as each higher level was also determined empirically for each level. The routine initially uses the uncertainty estimate for the current level.

After the loss has been measured, if the loss is significantly larger than the threshold selected by the operator, the routine continues with an uncertainty estimate for a higher level. For example, if the loss is sufficiently larger than the threshold, for all following levels the routine would select the uncertainty estimate in the table that corresponds to three levels higher than the current level. These empirically derived uncertainty estimates were confirmed with measurements of many reflectionless losses in actual fibers.

After the most accurate value for the anomaly's location has been determined, the loss at the anomaly is re-measured if the location is significantly different from the location value used when the loss was originally measured. The routine then reports the anomaly's characteristics an exits.

At each level, while collecting additional samples, the data is checked for a step-up that is greater than the noise. This indicates the leading edge of a reflective component at the anomaly. The routine responds by collecting more samples in the vicinity of the edge if more averaging is necessary, and saves the location of the edge as the location of the reflection. When a reflection is located, the routine stops sampling and processing additional levels. It then measures the loss at the anomaly, reports the anomaly's characteristics and exits.

If a reflection is not detected, the total number of levels performed by the routine is based on the amount of time available to locate the anomaly versus the amount of time required to sample and average the necessary number of data points for the signal-to-noise ratio in the interval. The less averaging required, the more levels the routine can execute in the allotted time.

By alternately reducing the noise and examining the data, fewer samples are collected than if all data points were sampled at final averaging in one pass. This is because the size of the region that must be sampled is reduced as the uncertainty in the location of the anomaly is reduced. In addition, an aberration such as a small reflective component at the anomaly can be processed, and further sampling stopped, as soon as the noise is reduced enough to resolve the aberration.

The routine locates a reflectionless loss in both a fast mode and an accurate mode. The fast mode is used during the initial examination of the fiber and is allowed relatively little time to measure the location of the anomaly. When a loss is detected between the current data point and either of the two previous points, the approximate location of the anomaly, where the reflectionless loss routine starts, is at the previous data point.

The accurate mode is used after the initial examination of the cable is complete and the resultant anomaly data is displayed. In accurate mode, the routine starts at the location found using the fast mode. An operator places a cursor at the displayed location of a reflectionless loss. If its location has not been determined to maximum accuracy, the system automatically invokes the reflectionless loss routine using the accurate mode, but completely re-samples the data in case the data has changed since the fast mode measurements were made. The accurate mode is allowed considerably more time than the fast mode, and so usually executes more levels and locates the anomaly with less uncertainty. With each successive level that improves the location accuracy, the display is updated to show the new location and estimated accuracy. In this way, the more time consuming measurements are limited to anomalies that the operator considers of interest.

The examination routine described previously may be implemented in different ways. One method is to acquire a minimum number of data points for detecting the presence of an anomaly over an interval defined by the data points, and determine if the loss over the interval is greater than the predicted loss of the fiber. If the loss falls within the predicted value, the interval is incremented by acquiring another data point, and the loss over the new interval is compared with the predicted loss.

When an anomaly is detected, the interval is re-examined with the appropriate reflection or reflectionless loss routine to characterize the anomaly. The characterized anomaly data may be displayed immediately or stored in a memory for display later. Examination of the fiber continues until the end of the cable is reached or the signal is so small that the number of averages needed to reduce the noise to the required level is too large to accomplish in a reasonable amount of time.

Another method consists of examining the entire fiber using a long pulsewidth to acquire and store a minimum number of data points. After the entire waveform of data is collected, the loss between data points is calculated and compared against the predicted loss. If the loss differs from the predicted loss by more than the uncertainty of the measurement, the appropriate routine is called to re-examine that portion of the fiber and to characterize the detected anomaly.

A method has been described that requires a minimum number of data points for examining a fiber optic cable. The number of samples averaged at each point along the fiber is varied to maintain only enough signal-to-noise ratio to detect an anomaly as large as a preselected threshold. The cable is examined by acquiring two data points along the fiber and comparing the computed loss between the points to a predicted rate of loss for the fiber. If the loss is greater than or less than the predicted loss, an anomaly is detected. If the loss is less than expected, a reflection location routine is called to characterize the anomaly. If the loss is greater than predicted, a reflectionless loss routine is called to characterize the anomaly.

The reflectionless loss routine repetitively examines the the region containing the anomaly to determine the location of the anomaly and to improve the accuracy of the location measurement. With each successive level of examination, additional samples are collected within the region. The new samples are combined with the existing samples thereby reducing the random noise in the data. The location of the anomaly is then re-determined with less uncertainty.

These and other aspects of the present invention are set forth in the appended claims.

We claim:

1. A method of examining an optical fiber for an anomaly associated with a discontinuity in the optical fiber wherein optical pulses are transmitted into the optical fiber for producing an optical return signal from the optical fiber, the steps comprising:

(a) sampling the optical return signal to acquire data points along the optical fiber having magnitude values representative of the optical return signal using a minimum number of samples for each data point for maintaining a minimum signal to noise ratio for detecting the anomaly at a minimum threshold value;

(b) detecting the presence and type of anomaly in the optical return signal as a function of the magnitude values of the acquired data points;

(c) transmitting optical pulses having an optimum pulse width for producing an adequately strong optical return signal over a region including the anomaly;

(d) sampling the optical return signal to acquire data points over the region including the anomaly for characterizing the detected anomaly; and (e) displaying the characteristics of the detected anomaly.

2. The method of examining an optical fiber as recited in claim 1 wherein the first sampling step comprises the steps of:
   (a) establishing the minimum threshold value for detecting the anomaly;
   (b) determining the number of samples required for each data point for maintaining the minimum signal to noise ratio for detecting the anomaly at the minimum threshold value; and
   (c) acquiring and averaging the samples for each data point.

3. The method of examining an optical fiber as recited in claim 1 wherein the detecting step comprises the steps of:
   (a) defining an interval using a minimum number of data points for detecting the presence and type of anomaly; and
   (b) comparing the difference in the magnitude values of the data points over the interval to a predicted value for the interval to detect the presence and type of anomaly.

4. The method of examining an optical fiber as recited in claim 3 further comprising the step of establishing additional interval using the acquired data points with each additional interval overlapping a portion of an adjacent interval, the establishing of additional intervals continuing while preselected conditions are met.

5. The method of examining an optical fiber as recited in claim 1 wherein the detected anomaly is a reflectionless loss, the second sampling step further comprising the step of ascertaining a location for the anomaly as a function of computing relative rates of loss for the acquired data points by summing magnitude values of data points prior to a particular data point and subtracting the magnitude values of an equal number of data points after the particular data point, the data point having the maximum relative rate of loss being the location of the anomaly.

6. The method of examining an optical fiber as recited in claim 5 further comprising the step of determining a minimum number of sample averages for each data point to establish a minimum signal to noise ratio based on a preselected threshold value.

7. The method of examining an optical fiber as recited in claim 5 further comprising the steps of:
   (a) determining a signal level loss for the anomaly;
   (b) comparing the signal level loss of the anomaly to a preselected threshold value;
   (c) decreasing the region encompassing the anomaly using empirically derived values that relate the anomaly loss to the preselected threshold value;
   (d) sampling the optical return signal over the decreased sample region for improving the signal level of the anomaly as a function of increasing the signal to noise ratio within the decreased sample region; and
   (e) repeating the ascertaining step while preselected conditions are met.

8. The method of examining an optical fiber as recited in claim 5 further comprising the step of terminating the examination of the sample region when the location of the anomaly falls outside the sample region or the anomaly loss is less than the preselected threshold value.

9. The method of examining an optical fiber as recited in claim 5 further comprising the steps of:
   (a) comparing the magnitude values of the acquired data points over the sample region to a computed noise level for the sample region to detect the presence of a reflective anomaly within the sample region;
   (b) characterizing the reflective anomaly; and
   (c) terminating the examination of the sample region.

10. The method of examining an optical fiber as recited in claim 1 wherein the anomaly is a reflection having a leading edge contained within an interval defined by a first acquired data point and a second acquired data point, each acquired data point having a magnitude value, the second sampling step further comprising the steps of:
    (a) sampling the optical return signal to acquire a bisecting data point within the interval having a magnitude value;
    (b) comparing the magnitude value of the bisecting data point to a threshold value and setting the bisecting data point as the first data point of the interval if the magnitude value of the bisecting data point is less than the threshold value, and setting the bisecting data point as the second data point of the interval if the magnitude value of the bisecting point is greater than the threshold value, the bisecting data point and the remaining data point defining the interval; and
    (c) repeating steps (a) and (b) while preselected conditions are met to establish a location for the leading edge of the reflection.

11. The method of examining an optical fiber as recited in claim 10 further comprising the steps of:
    (a) sampling the optical return signal starting at a minimum of one pulse width after the location of the leading edge of the reflection to acquire data points having magnitude values representative of the optical return signal;
    (b) determining a rate of loss over a selected number of data points using the magnitude values of the acquired data points;
    (c) comparing the rate of loss to a preselected value;
    (d) incrementing the location of the selected number of data points by one data point when the rate of loss does not fall within the preselected value;
    (e) repeating steps (b), (c) and (d) until the rate of loss falls within the preselected value;
    (f) establishing the last data point of the selected data points as the end of the reflection; and
    (g) determining a net loss for the reflection using the difference in magnitude values between the original first data point of the interval containing the leading edge of the reflection and the last data point of the selected number of data points and subtracting a predetermined rate of loss for the optical fiber.

12. The method of examining an optical fiber as recited in claim 11 further comprising the steps of:
    (a) transmitting optical pulses having an optimum pulse width for detecting the presence of additional reflections within the reflective anomaly;
    (b) sampling the optical return signal to acquire data points over the reflective anomaly for detecting the additional reflections; and
    (c) repeating the steps of claim 16 for characterizing the additional reflections within the reflective anomaly.

13. The method of examining an optical fiber as recited in claim 1 wherein the first sampling step and the detecting step comprise the steps of:
    (a) acquiring a first data point;

(b) predicting a magnitude value for a second data point; and (c) acquiring the second data point for defining an interval for detecting the presence and type of anomaly and comparing the predicted magnitude value to the magnitude value of the second data point for detecting the presence and type of anomaly within the interval.

14. The method of examining an optical fiber as recited in claim 13 further comprising the steps of:

(a) predicting magnitude values for additional data points; and (b) acquiring the additional data points for defining additional intervals and comparing the predicted magnitude value for each additional data point to the magnitude value of each additional data point for detecting the presence and type of anomaly within the additional intervals, each interval overlapping a portion of an adjacent interval and continuing while preselected conditions are met.

15. A method of examining an optical fiber for an anomaly indicative of a reflectionless loss wherein optical pulses are transmitted into the optical fiber for producing an optical return signal from the optical fiber, the steps comprising:

(a) sampling the optical return signal to acquire data points along the optical fiber over a region including the reflectionless loss anomaly having magnitude values representative of the optical return signal; and (b) ascertaining a location for the anomaly as a function of computing relative rates of loss for the acquired data points by summing magnitude values of data points prior to a particular data point and subtracting the magnitude values of an equal number of data points after the particular data point, the data point having the maximum relative rate of loss being the location of the anomaly.

16. The method of examining an optical fiber as recited in claim 15 further comprising the step of determining a minimum number of sample averages for each data point to establish a minimum signal to noise ratio based on a preselected threshold value.

17. The method of examining an optical fiber as recited in claim 15 further comprising the steps of:

(a) determining a signal level loss for the anomaly;

(b) comparing the signal level loss of the anomaly to a preselected threshold value;

(c) decreasing the region encompassing the anomaly using empirically derived values that relate the anomaly loss to the preselected threshold value;

(d) sampling the optical return signal over the decreased sample region for improving the signal level of the anomaly as a function of increasing the signal to noise ratio within the decreased sample region; and (e) repeating the ascertaining step while preselected conditions are met.

18. The method of examining an optical fiber as recited in claim 15 further comprising the step of terminating the examination of the sample region when the location of the anomaly falls outside the sample region or the anomaly loss is less than the preselected threshold value.

19. The method of examining an optical fiber as recited in claim 15 further comprising the steps of:

(a) comparing the magnitude values of the acquired data points over the sample region to a computed noise level for the sample region to detect the presence of a reflective anomaly within the sample region;

(b) characterizing the reflective anomaly; and (c) terminating the examination of the sample region.

20. A method of examining an optical fiber for an anomaly associated with a discontinuity in the optical fiber having a loss wherein optical pulses are transmitted into the optical fiber for producing an optical return signal from the optical fiber, the steps comprising:

(a) sampling the optical return signal to acquire a minimum number of data points having magnitude values representative of the optical return signal for defining an interval for detecting the presence of the anomaly;

(b) comparing the difference in the magnitude values of the data points over the interval to a preselected value for detecting the presence of the anomaly;

(c) dividing the interval into two regions when an anomaly is detected by sampling the optical return signal to acquire a data point within the interval and comparing the difference in the magnitude values of the data points defining each of the regions to the preselected value to detect the presence of the anomaly within one of the regions;

(d) dividing the regions containing the anomaly into two sub-regions by sampling the optical return signal to acquire a data point within the region and comparing the difference in the magnitude values of the data points defining each of the sub-regions to the preselected value to detect the presence of the anomaly within one of the sub-regions;

(e) repeating step (d) to decrease the sub-region containing the anomaly while preselected conditions are met;

(f) transmitting optical pulses having an optimum pulse width for producing an adequately strong optical return signal over the sub-region containing the anomaly;

(g) sampling the optical return signal to acquire data points over the sub-region containing the anomaly for characterizing the detected anomaly; and (h) displaying the characteristics of the detected anomaly.

21. The method of examining an optical fiber as recited in claim 20 wherein the dividing step (c) further comprises the step of sampling the optical return signal to acquire first and second data points within the interval for providing overlapping regions within the interval.

22. The method of examining an optical fiber as recited in claim 20 wherein the dividing step (d) further comprises the step of sampling the optical return signal to acquire first and second data points within the region containing the anomaly for providing overlapping sub-regions within the region.

23. The method of examining an optical fiber as recited in claim 20 further comprising the step of sampling the optical return signal to acquire additional data points for incrementing the interval until an end of signal or end of cable is detected, each additional interval overlapping a portion of an adjacent interval.

24. A method of examining an optical fiber for an anomaly associated with a discontinuity in the optical fiber having a loss wherein optical pulses are transmitted into the optical fiber for producing an optical return signal from the optical fiber, the steps comprising:

(a) sampling the optical return signal to acquire a first data point having a magnitude value representative of the optical return signal;

(b) predicting a magnitude value for a second data point;

(c) sampling the optical return signal to acquire the second data point for defining an interval for determining the presence of the anomaly and comparing the predicted magnitude value to the magnitude value of the second data point to determine the presence of the anomaly within the interval;

(d) dividing the interval into two regions when an anomaly is detected by predicting the magnitude value of a data point within the interval and sampling the optical return signal to acquire the data point within the interval and comparing the predicted magnitude value to the magnitude value of the data point within the interval to detect the presence of the anomaly within one of the regions;

(e) dividing the region containing the anomaly into two sub-regions by predicting a magnitude value for a data point within the region containing the anomaly and sampling the optical return signal to acquire the data point within the region and comparing the predicted magnitude value with the magnitude value of the data point with the region to detect the presence of the anomaly within one of the sub-regions;

(f) repeating step (e) to decrease the sub-region containing the anomaly while preselected conditions are met;

(g) transmitting optical pulses having an optimum pulse width for producing an adequately strong optical return signal over the sub-region containing the anomaly;

(h) sampling the optical return signal to acquire data points over the sub-region containing the anomaly for characterizing the detected anomaly; and (i) displaying the characteristics of the detected anomaly.

25. The method of examining an optical fiber as recited in claim 24 wherein the dividing step (d) further comprises the step of predicting, sampling, and comparing magnitude values for first and second data points within the interval for providing overlapping regions within the interval.

26. The method of examining an optical fiber as recited in claim 24 wherein the subdividing step (e) further comprises the step of predicting, sampling, and comparing magnitude values for first and second data points within the region containing the anomaly for providing overlapping sub-regions within the region.

27. The method of examining an optical fiber as recited in claim 24 further comprising the steps of:

(a) predicting a magnitude value for an additional data point for incrementing the interval;

(b) sampling the return optical signal to acquire the additional data point and comparing the predicted magnitude value to the magnitude value of the additional data point to detect the presence of an anomaly over the interval defined by the last acquired data point and the additional data point, each additional interval overlapping a portion of an adjacent interval; and (c) repeating steps (a) and (b) until an end of signal or end of cable is detected.

28. A method of examining an optical fiber for an anomaly associated with a discontinuity in the optical fiber wherein optical pulses are transmitted into the optical fiber for producing an optical return signal from the optical fiber, the steps comprising:

(a) establishing a minimum threshold value for detecting the anomaly;

(b) determining a minimum number of samples required for each data point of acquired data for maintaining a minimum signal to noise ratio for detecting the anomaly at the minimum threshold value;

(c) sampling the optical return signal to acquire a minimum number of data points along the optical fiber having magnitude values representative of the optical return signal for defining an interval for detecting the presence and type of anomaly;

(d) comparing the difference in the magnitude values of the data points over the interval to a predicted value for the interval to detect the presence and type of anomaly;

(e) transmitting optical pulses having an optimum pulse width for producing an adequately strong optical return signal over the interval containing the anomaly;

(f) sampling the optical return signal to acquire data point over the interval containing the anomaly for characterizing the detected anomaly;

(e) storing the characteristics of the detected anomaly;

(f) repeating steps (c) through (e) for establishing additional interval by acquiring additional data points, each additional interval overlapping a portion of an adjacent interval, the establishing of additional intervals continuing while preselected conditions are met; and (g) displaying the stored characteristics of the detected anomalies.

29. The method of examining an optical fiber as recited in claim 28 wherein the anomaly is a reflectionless loss, the second sampling step further comprising the steps of:

(a) ascertaining a location for the anomaly as a function of computing relative rates of loss for the acquired data points by summing magnitude values of data points prior to a particular data point and subtracting the magnitude values of an equal number of data points after the particular data point, the data point having the maximum relative rate of loss being the location of the anomaly;

(b) determining a signal level loss for the anomaly;

(c) comparing the signal level loss of the anomaly to the preselected threshold value;

(d) decreasing the sample region using empirically derived values that relate the anomaly loss to the preselected threshold value;

(e) sampling the optical return signal over the decreased sample region for improving the signal level of the anomaly as a function of increasing the signal to noise ratio within the decreased sample region;

(f) comparing the magnitude values of the acquired data points over the sample region to a computed noise level for the sample region to detect the presence of a reflective anomaly within the sample region;

(g) characterizing of the reflective anomaly;

(h) terminating the examination of the sample region when the location of the anomaly falls outside the sample region, the anomaly loss is less than the preselected threshold value or a reflective anomaly is detected; and (i) repeating steps (a) through (h) while preselected conditions are met.

30. The method of examining an optical fiber as recited in claim 28 wherein the anomaly is a reflection, the second sampling step further comprising the steps of:

(a) sampling the optical return signal to acquire a bisecting data point within the interval having a magnitude value;

(b) comparing the magnitude value of the bisecting data point to a threshold value and setting the bisecting data point as the first data point of the interval if the magnitude value of the bisecting data point is less than the threshold value, and setting the bisecting data point as the second data point of the interval if the magnitude value of the bisecting point is greater than the threshold value, the bisecting data point and the remaining data point defining the interval; and (c) repeating steps (a) and (b) while preselected conditions are met to establish a location for the leading edge of the reflection;

(d) sampling the optical return signal starting at a minimum of one pulse width after the location of the leading edge of the reflection to acquire data points having magnitude values representative of the optical return signal;

(e) determining a rate of loss over a selected number of data points using the magnitude values of the acquired data points;

(f) comparing the rate of loss to a preselected value;

(g) incrementing the location of the selected number of data points by one data point when the rate of loss does not fall within the preselected value;

(h) repeating steps (e), (f) and (g) until the rate of loss falls within the preselected value;

(i) establishing the last data point of the selected data points as the end of the reflection;

(j) determining a net loss for the reflection using the difference in magnitude values between the original first data point of the interval containing the leading edge of the reflection and the last data point of the selected number of data points and subtracting a predetermined rate of loss for the optical fiber;

(k) transmitting optical pulses having an optimum pulse width for detecting the presence of additional reflections within the reflective anomaly;

(l) sampling the optical return signal to acquire data points over the reflective anomaly for detecting the additional reflections; and (m) repeating steps (a) through (c) for characterizing the additional reflections within the reflective anomaly.

31. A method of examining an optical fiber for an anomaly associated with a discontinuity in the optical fiber wherein optical pulses are transmitted into the optical fiber for producing an optical return signal from the optical fiber, the steps comprising:

(a) sampling the optical return signal to acquire data points along the optical fiber having magnitude values representative of the optical return signal;

(b) detecting the presence and type of anomaly in the optical return signal as a function of the magnitude values of the acquired data points over an interval;

(c) transmitting optical pulses having an optimum pulse width for producing an adequately strong optical return signal over a region including the interval containing the anomaly;

(d) sampling the optical return signal to acquire data points over the region including the interval containing the anomaly for characterizing the detected anomaly; and (e) displaying the characteristics of the detected anomaly.

32. The method of examining an optical fiber as recited in claim 31 wherein the first sampling step comprises the steps of:

(a) establishing a minimum threshold value for detecting the anomaly;

(b) determining the number of samples required for each data point for maintaining a minimum signal to noise ratio for detecting the anomaly at the minimum threshold value; and (c) acquiring and averaging the samples for each data point.

33. The method of examining an optical fiber as recited in claim 31 wherein the detecting step comprises the steps of:

(a) defining the interval using a minimum number of data points for detecting the presence and type of anomaly; and (b) comparing the difference in the magnitude values of the data points over the interval to a predicted value for the interval to detect the presence and type of anomaly.

34. The method of examining an optical fiber as recited in claim 33 further comprising the step of establishing additional interval using the acquired data points with each additional interval overlapping a portion of an adjacent interval, the establishing of additional intervals continuing while preselected conditions are met.

* * * * *